(12) United States Patent
Tokashiki

(10) Patent No.: US 9,246,082 B2
(45) Date of Patent: Jan. 26, 2016

(54) METHOD OF FORMING MAGNETIC MEMORY DEVICES

(71) Applicant: Ken Tokashiki, Seongnam-si (KR)

(72) Inventor: Ken Tokashiki, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/286,407

(22) Filed: May 23, 2014

(65) Prior Publication Data

US 2015/0044781 A1  Feb. 12, 2015

(30) Foreign Application Priority Data

Aug. 9, 2013  (KR) .................. 10-2013-0094925

(51) Int. Cl.
*H01L 21/00* (2006.01)
*H01L 43/12* (2006.01)
*H01L 21/02* (2006.01)
*H01L 27/22* (2006.01)

(52) U.S. Cl.
CPC ............ *H01L 43/12* (2013.01); *H01L 21/02071* (2013.01); *H01L 27/222* (2013.01); *H01L 27/224* (2013.01); *H01L 27/226* (2013.01)

(58) Field of Classification Search
CPC ............ H01L 21/02071; H01L 27/222; H01L 27/224; H01L 27/226
USPC .......................................................... 438/3
See application file for complete search history.

(56) References Cited

U.S. PATENT DOCUMENTS

| | | | |
|---|---|---|---|
| 5,695,864 A | 12/1997 | Slonczewski | |
| 7,015,524 B2 | 3/2006 | Ikeda | |
| 7,358,553 B2 | 4/2008 | Drewes et al. | |
| 7,696,551 B2 | 4/2010 | Xiao et al. | |
| 8,018,684 B2 | 9/2011 | Ma et al. | |
| 2003/0231437 A1* | 12/2003 | Childress et al. | 360/324.12 |
| 2005/0048675 A1 | 3/2005 | Ikeda | |
| 2005/0274998 A1* | 12/2005 | Fontana et al. | 257/295 |
| 2006/0192235 A1 | 8/2006 | Drewes et al. | |
| 2008/0212242 A1 | 9/2008 | Ma et al. | |
| 2009/0078927 A1 | 3/2009 | Xiao et al. | |
| 2010/0044340 A1 | 2/2010 | Kodaira et al. | |
| 2013/0029431 A1* | 1/2013 | Takahashi et al. | 438/3 |
| 2013/0146997 A1 | 6/2013 | Lee et al. | |
| 2013/0149499 A1 | 6/2013 | Lee et al. | |

FOREIGN PATENT DOCUMENTS

| | | |
|---|---|---|
| JP | 2005-277249 A | 10/2005 |
| KR | 10-0445064 B1 | 8/2004 |
| KR | 20100005058 A | 1/2010 |

* cited by examiner

*Primary Examiner* — Karen Kusumakar
(74) *Attorney, Agent, or Firm* — Harness, Dickey & Pierce

(57) ABSTRACT

Provided is a method of forming a magnetic memory device. A first magnetic layer, a tunnel barrier, and a second magnetic layer are deposited on a substrate. The second magnetic layer, the tunnel barrier, and the first magnetic layer are etched to form magnetic tunnel junction structures. An ion beam etching process is performed using an oxygen-containing source gas to remove etching by-products on sidewalls of the magnetic tunnel junction structure and to oxidize the sidewalls of the magnetic tunnel junction structures.

15 Claims, 7 Drawing Sheets

METHOD OF FORMING MAGNETIC MEMORY DEVICES

CROSS-REFERENCE TO RELATED APPLICATIONS

This U.S. non-provisional patent application claims priority under 35USC §119 to Korean Patent Application No. 10-2013-0094925, filed on Aug. 9, 2013, the entirety of which is hereby incorporated by reference.

BACKGROUND

The inventive concepts described herein generally relate to magnetic memory devices and/or to methods of forming magnetic memory devices.

As electronic devices trend toward high speed and low power consumption, high-speed read/write operations and low operating voltages are required for semiconductor memory devices incorporated therein. In order to meet the above requirement, magnetic memory devices have been proposed as semiconductor memory devices. Since magnetic memory devices may operate at high speed and have nonvolatile characteristics, they have attracted considerable attention as the next-generation memory devices.

A magnetic memory device may include a magnetic tunnel junction (MTJ). The magnetic tunnel junction may include two magnetic structures and a tunnel barrier layer disposed therebetween. The resistance of the magnetic tunnel junction may vary depending on magnetization directions of the two magnetic structures. For example, when magnetization directions of two magnetic structures are anti-parallel to each other, a magnetic tunnel junction may have a relatively high resistance. When magnetization directions of two magnetic structures are parallel to each other, a magnetic junction tunnel may have a relatively low resistance. A magnetic memory device may write/read data using the resistance difference between the high resistance and the low resistance of the magnetic junction tunnel.

With the remarkable advance in electronic industry, there is an increasing demand for high density and/or low power consumption of magnetic memory devices. Accordingly, many studies have been conducted to meet these demands.

SUMMARY

Example embodiments of the inventive concepts provide methods of forming a magnetic memory device. In some example embodiments, a method of forming a magnetic memory device may include sequentially depositing a first magnetic layer, a tunnel barrier, and a second magnetic layer on a substrate; etching the second magnetic layer, the tunnel barrier layer, and the first magnetic layer to form magnetic tunnel junction structures; and performing an ion beam etching process using an oxygen-containing reactive source gas to remove etching by-products on sidewalls of the magnetic tunnel junction structures and simultaneously to oxidize the sidewalls of the magnetic tunnel junction structures.

In an example embodiment, the oxygen-containing reactive source gas may not include hydrogen.

In an example embodiment, the oxygen-containing reactive source gas may include at least one of $O_2$, $O_3$, NO, $NO_2$, $N_2O$, CO, and $CO_2$.

In an example embodiment, incident energy of the ion beam may be about 1 keV or less.

In an example embodiment, the ion beam etching process may further include performing the ion beaming etching process using an inert gas as a source gas.

In an example embodiment, the inert gas may include at least one of helium (He), neon (Ne), argon (Ar), krypton (Kr) and xenon (Xe).

In an example embodiment, the ion beam etching process may be performed at a temperature of about −273 degrees centigrade to about 30 degrees centigrade.

In an example embodiment, a metal oxide layer may be formed by oxidation of the sidewalls of the magnetic tunnel junction structures.

In an example embodiment, a thickness of the metal oxide layer may be between about 1 nm and about 6 nm.

In an example embodiment, etching the second magnetic layer, the tunnel barrier, and the first magnetic layer to form magnetic tunnel junction structures may be accomplished by means of reactive ion etching.

In other example embodiments, a method of forming a magnetic memory device may include forming a magnetic layer on a substrate; patterning the magnetic layer to form magnetic patterns separated from each other; and performing an ion beam etching process using an oxygen-containing reactive source gas to remove conductive etching by-products formed on sidewalls of the magnetic patterns and simultaneously to form a metal-oxide layer on the sidewalls of the magnetic patterns.

In an example embodiment, the oxygen-containing reactive source gas may not include hydrogen.

In an example embodiment, the oxygen-containing reactive source gas may include at least one of $O_2$, $O_3$, NO, $NO_2$, $N_2O$, CO, and $CO_2$.

In an example embodiment, incident energy of the ion beam may be about 1 keV or less.

In an example embodiment, the ion beam etching process may further include performing the ion beaming etching process using an inert gas as a source gas.

BRIEF DESCRIPTION OF THE DRAWINGS

Example embodiments of the inventive concepts will become more apparent in view of the attached drawings and accompanying detailed description. The example embodiments depicted therein are provided by way of example, not by way of limitation, wherein like reference numerals refer to the same or similar elements. The drawings are not necessarily to scale, emphasis instead being placed upon illustrating examples of the inventive concepts.

DETAILED DESCRIPTION

Figure 1:
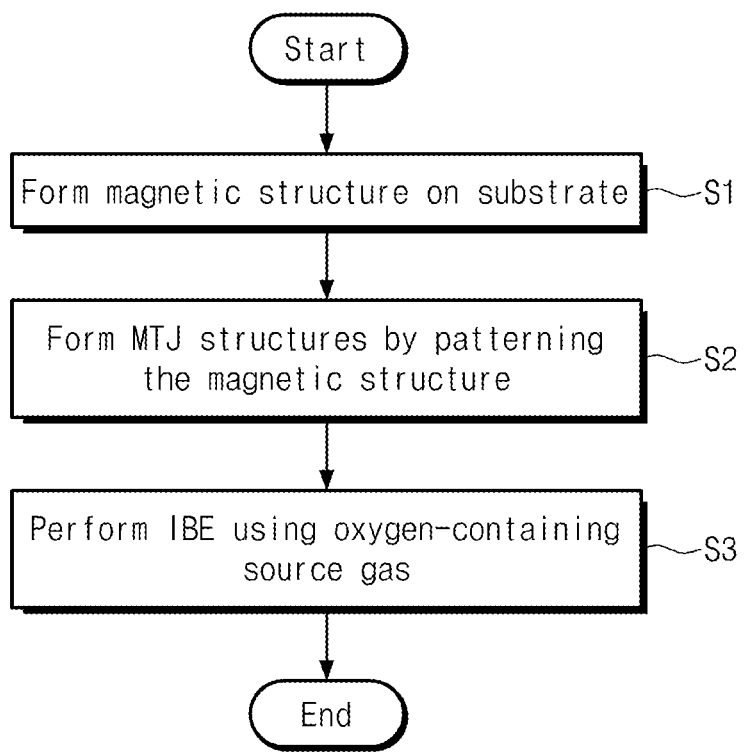
FIG. 1 is a flowchart illustrating a method of forming a magnetic memory device according to an example embodiment of the inventive concepts.

The advantages and features of the example inventive concepts and methods will be apparent from the example embodiments that will be described in more detail with reference to the accompanying drawings. It should be noted, however, that the inventive concepts are not limited to the following example embodiments, and may be implemented in various forms. Accordingly, the example embodiments are provided only to disclose examples in accordance with the inventive concepts and to let those skilled in the art understand the nature of the inventive concepts.

In the drawing figures, the dimensions of layers and regions may be exaggerated for clarity of illustration. Like reference numerals refer to like elements throughout. The same reference numbers indicate the same components throughout the specification.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing example embodiments only and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Example embodiments of the inventive concepts will be described below with reference to various views, which are example drawings that demonstrate examples of the inventive concepts. The items, layers, structures and the like depicted in the example drawings may be modified by manufacturing techniques and/or tolerances. Accordingly, the example embodiments are not limited to specific configurations shown in the drawings, and include modifications based on the method of manufacturing the semiconductor device, for example.

Though terms like a first, a second, and a third are used to describe various elements in various example embodiments, the elements are not limited to these terms. These terms are used only to tell one element from another element, but not to imply a required sequence of elements. For example, a first element can be termed a second element, and, similarly, a second element can be termed a first element, without departing from the scope of the present inventive concepts. As used herein, the term "and/or" includes any and all combinations of one or more of the associated listed items.

The terms used in the present specification are used to describe an example embodiment and are not used to limit the present inventive concepts. As in the present specification, a singular form may include a plural form unless the singular form definitely indicated otherwise in the context. Also, in the present specification, the terms "comprise" or "include" and/or "comprising" and "including" specify existence of shapes, numbers, steps, operations, members, elements, and/or groups thereof, which are referred to, and do not exclude existence or addition of one or more different shapes, numbers, operations, members, elements, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

FIG. 1 is a flowchart illustrating a method of forming a magnetic memory device according to an example embodiment of the inventive concepts. FIGS. 2 to 5 are cross-sectional views illustrating a method of forming a magnetic memory device according to an example embodiment of the inventive concepts.

Figure 2:
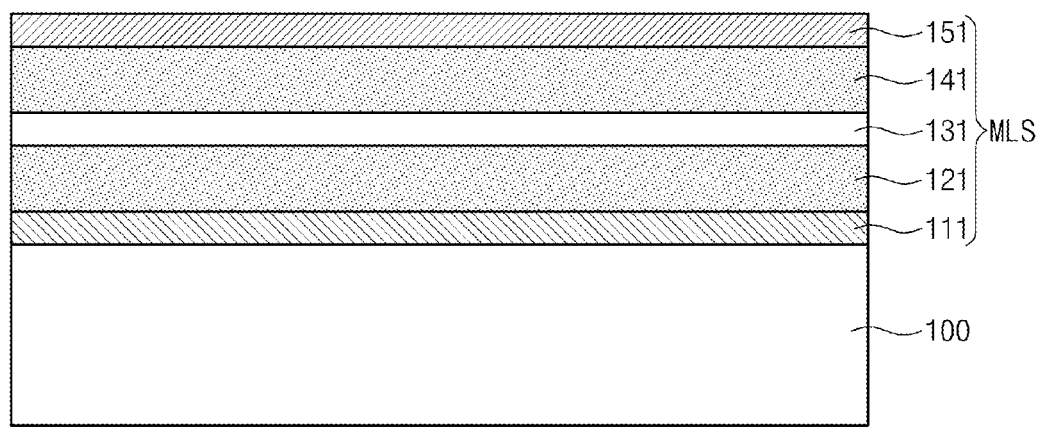
FIGS. 2 to 5 are cross-sectional views illustrating a method of forming a magnetic memory device according to an example embodiment of the inventive concepts.

According to at least one example embodiment, referring to FIGS. 1 and 2, a magnetic structure MLS may be formed on a substrate 100 (operation S1 in FIG. 1). The substrate 100 may be an arbitrary semiconductor-based substrate having a silicon surface. The substrate 100 may include one of, for example, silicon, silicon-on-insulator (SOI), silicon germanium (SiGe), germanium (Ge), gallium arsenide (GaAs), and a silicon epitaxial layer supported by a semiconductor structure.

In an example embodiment, the magnetic structure MLS may include, sequentially deposited, a first electrode layer 111, a first magnetic layer 121, a tunnel barrier layer 131, a second magnetic layer 141, and a second electrode layer 151. The first electrode 111 and the second electrode 151 may be formed of at least one selected from a transition metal, a conductive transition metal nitride, and a conductive ternary nitride. One of the first and second magnetic layers 121 and 141 may be a layer to form a free layer of a magnetic tunnel junction (MTJ) that will be explained below, and the other is a layer to form a pinned layer of the magnetic tunnel junction. For brevity of description, it is described that the first layer 121 is a layer to form a pinned layer and the second layer 141 is a layer to form a free layer. However, the first magnetic layer 121 may be a layer to form a free layer and the second magnetic layer 141 may be a layer to form a pinned layer.

In an example embodiment, the first and second magnetic layers 121 and 141 may be magnetic layers to form a horizontal magnetization structure with a magnetization direction that is substantially parallel to a top surface of the tunnel barrier layer 131. In an example embodiment, the first magnetic layer 121 may include a layer including an antiferromagnetic material and a layer including a ferromagnetic material. The layer including an antiferromagnetic material may include at least one of PtMn, IrMn, MnO, MnS, MnTe, $MnF_2$, $FeCl_2$, FeO, $CoCl_2$, CoO, $NiCl_2$, NiO, and Cr. In an example embodiment, the layer including an antiferromagnetic material may include at least one selected from precious metals. The precious metal may include ruthenium (Ru), rhodium (Rh), palladium (Pd), osmium (Os), iridium (Ir), platinum (Pt), gold (Au) or silver (Ag). The layer including a ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The second magnetic layer 141 may include a material having a variable magnetization direction. The second magnetic layer 141 may include a ferromagnetic material. The second magnetic layer 141 may include at least one selected from, for example, FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The second magnetic layer 141 may include a plurality of layers. For example, the second magnetic layer 141 may include layers including a plurality of ferromagnetic materials and a layer including a non-magnetic material disposed between the layers including a plurality of ferromagnetic materials. In this case, the layers including ferromagnetic materials and the layer including a non-magnetic material may constitute a synthetic antiferromagnetic layer. The synthetic antiferromagnetic layer may reduce critical current density and enhance thermal stability.

In another example embodiment, the first magnetic layer 121 and the second magnetic layer 141 may form a vertical magnetization structure with a magnetization direction that is substantially vertical or perpendicular to a top surface of the tunnel barrier layer 131. In an example embodiment, the first magnetic layer 121 and the second magnetic layer 141 may include at least one of a material having an L10 crystal structure, a material having a hexagonal close packed structure, and anamorphous rare-earth transition metal (RE-TM) alloy. For example, the first magnetic layer 121 and the second magnetic layer 141 may be at least one material having an L10 crystal structure including $Fe_{50}Pt_{50}$, $Fe_{50}Pd_{50}$, $Co_{50}Pt_{50}$, $Co_{50}Pd_{50}$, and $Fe_{50}Ni_{50}$. Alternatively, the first magnetic layer 121 and the second magnetic layer 141 may include a hexagonal close packed structure including a cobalt-platinum (CoPt) disordered alloy having a platinum content in a range of about 10% to about 45% by atomic percent or a $Co_3Pt$ ordered alloy. Alternatively, the first magnetic layer 121 and the second magnetic layer 141 may include at least one amorphous RE-TM alloys including at least one of iron (Fe), cobalt (Co), and nickel (Ni) and at least one selected from terbium (Tb), dysprosium (Dy), and gadolinium (Gd), which are rare-earth metals.

The first magnetic layer 121 and the second magnetic layer 141 may include a material having interface perpendicular magnetic anisotropy. The interface perpendicular magnetic anisotropy is a phenomenon where a magnetic layer having an intrinsic horizontal magnetization property has a perpendicular magnetization direction due to an effect from an interface with another layer adjacent to the magnetic layer. The term "intrinsic horizontal magnetization property" is a property where a magnetic layer has a magnetization direction parallel to its widest surface when there is no extrinsic factor. For example, when a magnetic layer having an intrinsic horizontal magnetization property is formed on a substrate and there is no extrinsic factor, a magnetization direction of the magnetic layer may be substantially parallel to a top surface of the substrate.

In an example embodiment, the first magnetic layer 121 and the second magnetic layer 141 may include at least one of cobalt (Co), iron (Fe), and nickel (Ni). The first magnetic layer 121 and the second magnetic layer 141 may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). In an example embodiment, the first magnetic layer 121 and the second magnetic layer 141 includes CoFe or NiFe and may further include boron (B). In addition, the first magnetic layer 121 and the second magnetic layer 141 may include at least one of titanium (Ti), aluminum (Al), silicon (Si), magnesium (Mg), and tantalum (Ta) to reduce a saturation magnetization amount of the first magnetic layer 121 and of the second magnetic layer 141. The first magnetic layer 121 and the second magnetic layer 141 may be formed by sputtering or plasma-enhanced chemical vapor deposition (PECVD).

The tunnel barrier layer 131 may include at least one of oxide of magnesium (Mg), oxide of titanium (Ti), oxide of aluminum (Al), oxide of magnesium-zinc (MgZn), oxide of magnesium-boron (MgB), nitride of titanium (Ti), and nitride of vanadium (V). For example, the tunnel barrier layer 131 may be a single layer of magnesium oxide (MgO). Alternatively, the tunnel barrier layer 131 may include a plurality of layers. The tunnel barrier layer 131 may be formed by means of chemical vapor deposition (CVD).

Figure 3:
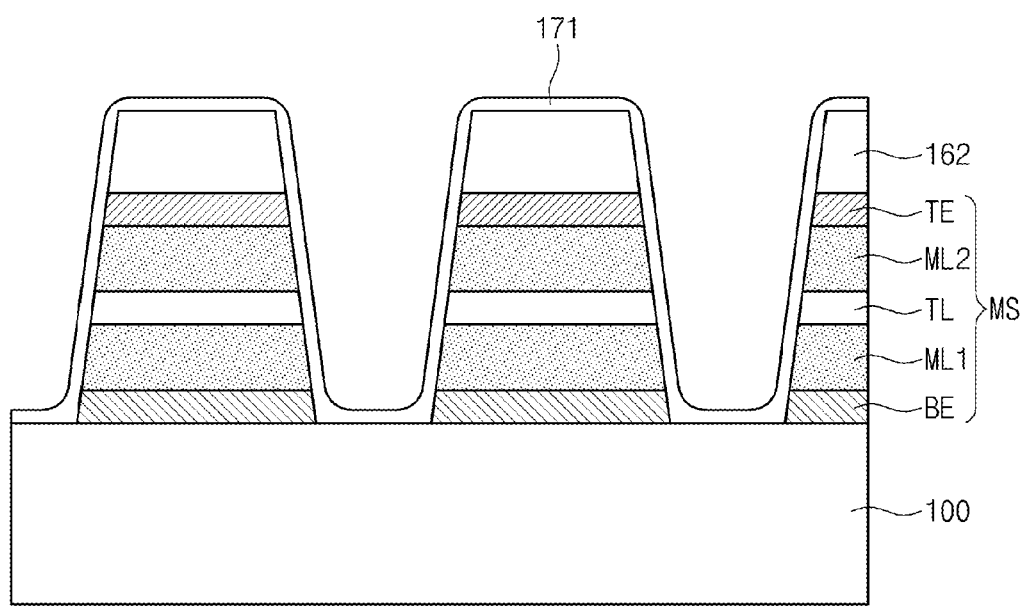

According to at least one example embodiment, referring to FIGS. 1 and 3, a plurality of magnetic tunnel junction structures MS may be formed by patterning the magnetic structure MLS (operation S2). The patterning process may be performed by an etch process using a mask pattern 162 formed on the second electrode layer 151 as an etch mask. In an example embodiment, the mask pattern 162 may include at least one of silicon oxide, silicon nitride, and silicon oxynitride. Each of the magnetic tunnel junction structures MS may include a bottom electrode BE, a first magnetic pattern ML1, a tunnel barrier TL, a second magnetic pattern ML2, and a top electrode TE. The etch process may be an ion sputtering process and/or a reactive ion etch (RIE) process.

According to at least one example embodiment, during the patterning process, etching by-products may be produced. The magnetic tunnel junction structures MS may include a large amount of metal such as Pt, Pd, Co, Mg, Fe or a rare metal. Thus, an etch process for forming the magnetic tunnel junction structures MS may exhibit a lower etch rate than an etch process for etching silicon or an insulating layer and produce many etching by-products. The etching by-products may exhibit a lower saturated vapor pressure than etching by-products that are produced when non-metals such as silicon or silicon oxide are etched. Thus, the etching by-products may remain on sidewalls of the magnetic tunnel junction structures MS to produce a large amount of conductive etch residues 171. For brevity of description, it is illustrated that the conductive etch residues 171 may be successively produced on the substrate 100 where the magnetic tunnel junction structures MS are formed. However, the inventive concepts are not limited thereto. In particular, when the conductive etch residues 171 are attached to the sidewall of the tunnel barrier TL, a short-circuit may occur between the first magnetic pattern ML1 and the second magnetic pattern ML2 during operation of a magnetic memory cell. When the conductive etch residues 171 remain between adjacent magnetic tunnel junction structures MS, the adjacent tunnel junction structures MS may have undesired electrical connections. Such a phenomenon may increase as a distance between adjacent tunnel junction structures MS is reduced to about 100 nanometers or less with the high integration of a device.

Figure 4:
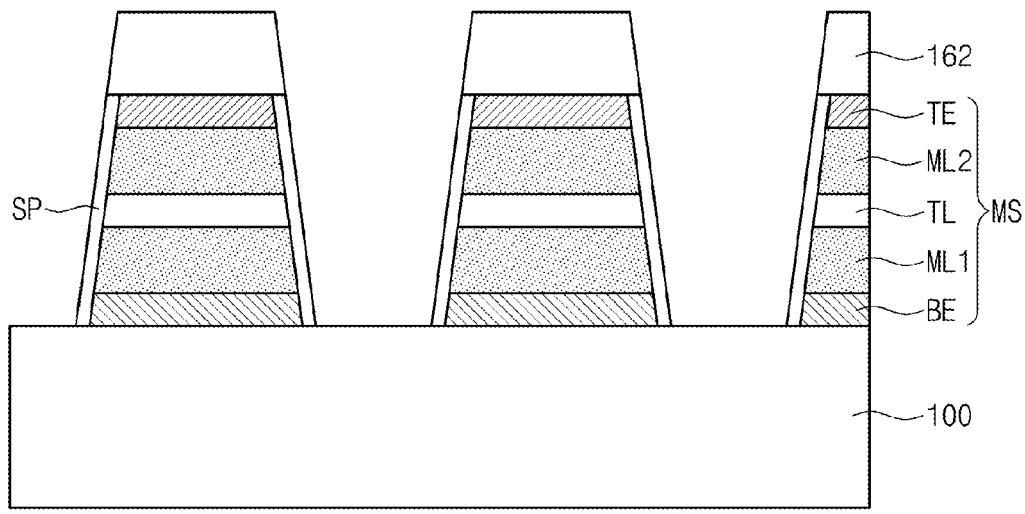

According to at least one example embodiment, referring to FIGS. 1 and 4, a dry cleaning process, i.e., ion beam etching (IBE) using an oxygen-containing source gas may be performed on the magnetic tunnel junction structures (MS). Thus, the conductive etch residues 171 on the sidewall of the magnetic tunnel junction structures MS may be reduced and, at the same time, the sidewalls of the magnetic tunnel junction structures MS may be oxidized to form a sidewall oxide layer SP. The sidewall oxide layer may prevent a short-circuit between the first magnetic pattern ML1 and the second magnetic pattern ML2 or a short-circuit between adjacent magnetic tunnel junction structures MS in a subsequent process.

In an example embodiment, the sidewall oxide layer SP may include metal oxide. A thickness of the sidewall oxide layer SP may be between about 1 nanometer and about 6 nanometers. Hereinafter, the ion beam etching (IBE) process will be described in detail with reference to FIG. 6.

Figure 6:
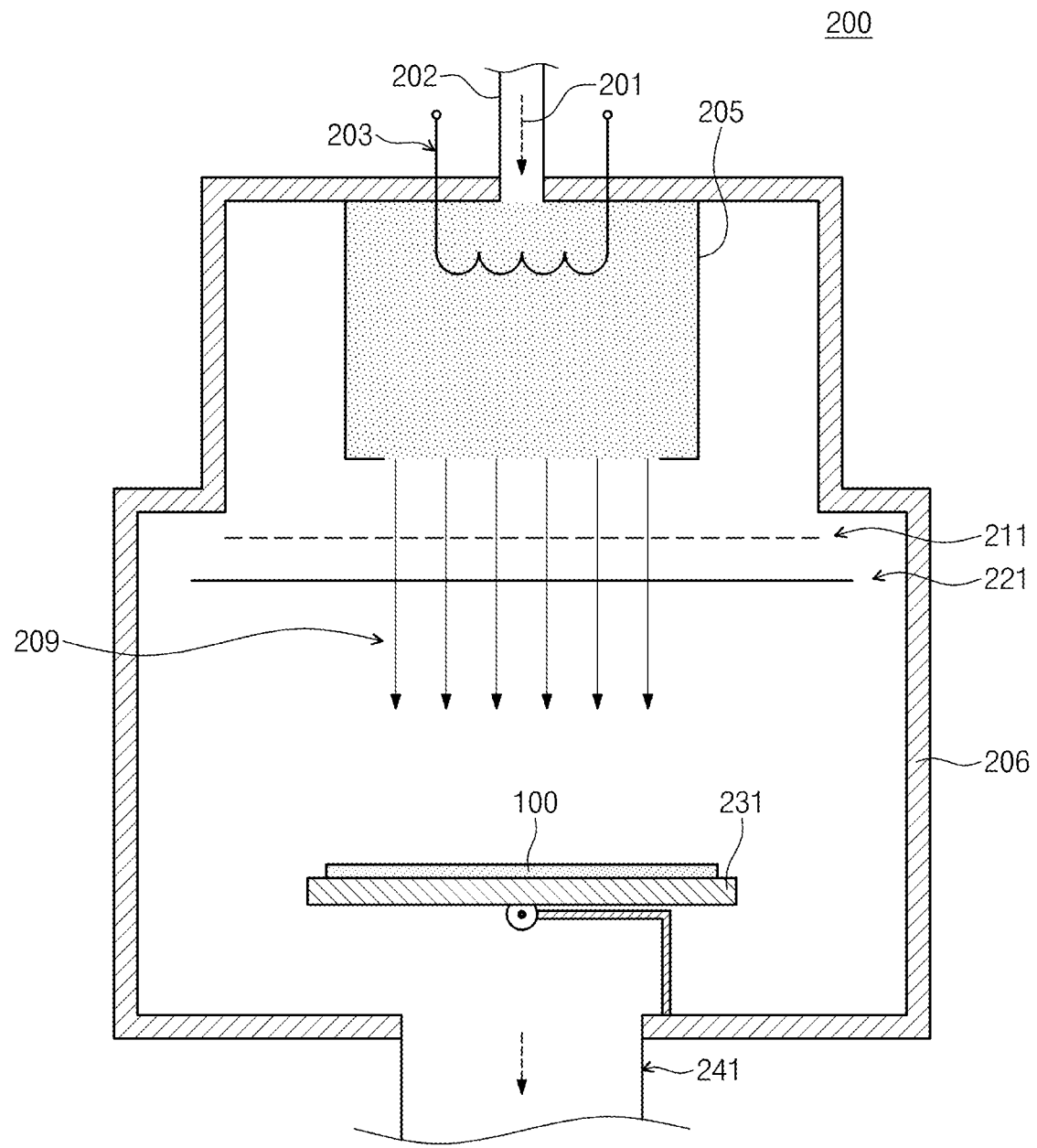
FIG. 6 is a conceptual diagram illustrating an ion beam etching process according to an example embodiment of the inventive concepts.

FIG. 6 is a conceptual diagram illustrating an ion beam etching (IBE) process according to at least one example embodiment of the inventive concepts. The IBE process may be performed inside an ion beam reactor 200. In an example embodiment, the IBE process may be performed at a temperature of about −273° C. to about 30° C. The ion beam reactor 200 may include a gas inlet 202 to introduce a source gas 201 into a plasma chamber 205 inside a process chamber 206 and a high-temperature filament 203 to generate electrons such that plasma is generated from the introduced source gas 201. In example embodiments of the inventive concepts, the source gas 201 may be an oxygen-containing reactive gas. In an example embodiment, the source 201 may include at least one of $O_2$, $O_3$, NO, $NO_2$, $N_2O$, CO, and $CO_2$. The source gas 201 may not include hydrogen so as to reduce an etching damage. Oxygen atoms in the source gas 201 may be transformed in the form of ions by the electrons generated from the high-temperature filament 203. In an example embodiment, the plasma generated from the source gas 201 may include oxygen ions such as $O^+$ or $O_2^+$. The generation of the oxygen ions may be done inside the plasma chamber 205, and an electromagnet is disposed on an outer wall of the plasma chamber 205 to promote the generation of the oxygen ions.

The oxygen ions may be extracted and accelerated to the outside of the plasma chamber 205 by a grid 211 to form an ion beam 209. In an example embodiment, the grid 211 may include an extracting grid to extract the oxygen ions and an accelerating grid to accelerate the extracted oxygen ions. In an example embodiment, the extracting grid may be supplied with a negative voltage and the accelerating grid may be supplied with a positive voltage. The ion beam 209 may reach a substrate 100 through a neutralizer filament 221. In an example embodiment, incident energy of the ion beam 209 may be about 1 keV or less. The neutralizer filament 221 may discharge electrons recombined with the oxygen ions.

The substrate 100 may be disposed on a table 231, and an angle of the table 231 may be adjusted to adjust an angle of the ion beam 209 colliding with the substrate 100. In an example embodiment, an angle between the ion beam 209 and the substrate 100 may be between about zero degree (°) and about 60 degrees (°). The process chamber 206 may be maintained in a vacuum state by the vacuum chamber 241.

In an example embodiment, the ion beam etching process may further include a second similar process using an inert gas as a source gas in addition to the first process performed using the oxygen-containing source gas. In an example embodiment, the inert gas may include at least one of helium (He), neon (Ne), argon (Ar), krypton (Kr), xenon (Xe). Incident energy in the second process may be about 200 eV or less, which is smaller than the incident energy in the first process. The second process may be performed before or after the first process.

According to example embodiments of the inventive concepts, an ion beam etching process may be performed using an oxygen-containing source gas to remove etching by-products formed on sidewalls of magnetic tunnel junction structures and simultaneously oxidize the sidewalls of the magnetic tunnel junction structures. As a result, short-circuit between magnetic layers or adjacent magnetic tunnel junction structures may be easily reduced, or alternatively prevented, by performing the process only once and thus without having to perform a plurality of processes.

Figure 5:
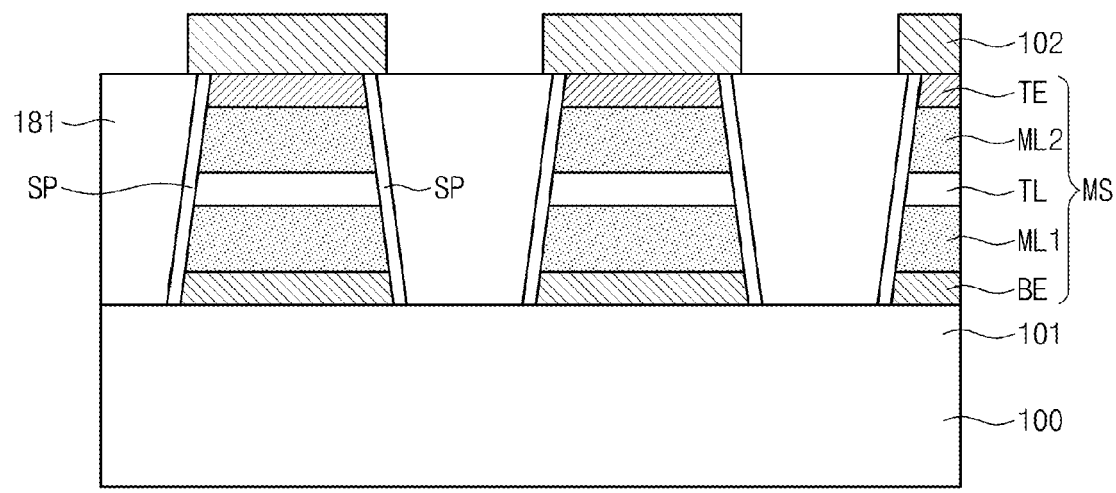

According to at least one example embodiment, referring to FIG. 5, an interlayer dielectric 181 may be formed to fill a space between the magnetic tunnel junction structures MS. In an example embodiment, the interlayer dielectric 181 may include at least one of silicon oxide, silicon nitride, and silicon oxynitride. The formation of the interlayer dielectric 181 may include depositing an insulating layer on the substrate 100 and performing a planarization process to expose the top electrode TE.

Conductive lines 102 may be formed on the magnetic tunnel junction structures MS. The conductive lines 102 may be formed of at least one selected from a transition metal, conductive transition metal nitride, and conductive ternary nitride. The conductive lines 102 may be formed by sputtering or plasma-enhanced chemical vapor deposition (PECVD).

Figure 7:
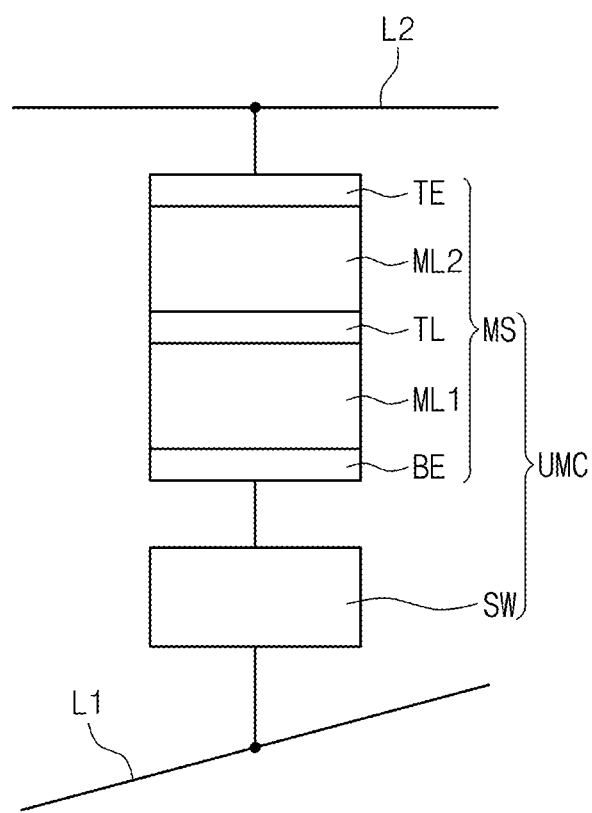
FIG. 7 is a circuit diagram of a unit memory cell of a magnetic memory device including magnetic tunnel junction structures according to example embodiments of the inventive concepts.

FIG. 7 is a circuit diagram of a unit memory cell of a magnetic memory device including magnetic tunnel junction structures, according to example embodiments of the inventive concepts.

Referring to FIG. 7, a unit memory cell UMC may be disposed between a first conductive line L1 and a second conductive line L2 to connect the first and second conductive lines L1 and L2 to each other. The unit memory cell UMC may include a selection element SW and a magnetic tunnel junction structure MS. The selection element SW and the magnetic tunnel junction structure MS may be electrically connected in series. One of the first and second conductive lines L1 and L2 may be used as a word line, and the other of the first and second conductive lines L1 and L2 may be used as a bit line.

The selection element SW may be configured to selectively control the flow of charges passing through the magnetic tunnel junction structure MS. For example, the selection element SW may be one of a diode, a PNP bipolar transistor, an NPN bipolar transistor, an NMOS field effect transistor, and a PMOS field effect transistor. If the selection element SW comprises a bipolar transistor or a MOS field effect transistor that is a three-terminal element, an additional conductive line (not shown) may be connected to the selection element SW.

The magnetic tunnel junction structure MS may include a first magnetic pattern ML1, a second magnetic pattern ML2, and a tunnel barrier TL disposed therebetween. Each of the first and second magnetic patterns ML1 and ML2 may include at least one magnetic layer. In an example embodiment, the magnetic tunnel junction structure MS may include a bottom electrode BE disposed between the first magnetic pattern ML1 and the selection element SW and a top electrode TE disposed between the second magnetic pattern ML2 and the second conductive line L2.

A magnetization direction of one of the first and second magnetic patterns ML1 and ML2 is pinned irrespective of an external magnetic field, under a conventional use environment. In at least one example embodiment, a magnetic layer having such a pinned magnetization property will be referred to as a pinned layer. A magnetization direction of the other of the first and second magnetic patterns ML1 and ML2 may be switched by an external magnetic field applied thereto. In at least one example embodiment, a magnetic layer having such a variable magnetization property will be referred to as a free layer. Electric resistance of the magnetic tunnel junction structure MS may be dependent on the magnetization directions of the free layer and the pinned layer. For example, the electrical resistance of the magnetic tunnel junction structure MS may be much greater when the magnetization directions of the free layer and of the pinned layer are antiparallel than when the magnetization directions are parallel. As a result, the electrical resistance of the magnetic tunnel junction structure MS may be adjusted by changing the magnetization direction of the free layer, which may be used as the data storage principle in a magnetic memory device according to the example inventive concepts.

The magnetic memory devices according to example embodiments of the inventive concepts may be implemented as various types of semiconductor packages. For example, semiconductor memory devices according to example embodiments of the inventive concepts may be packaged in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP). A package mounting the semiconductor memory device according to example embodiments of the inventive concepts may further include a controller and/or a logic device for controlling the semiconductor memory device.

Figure 8:
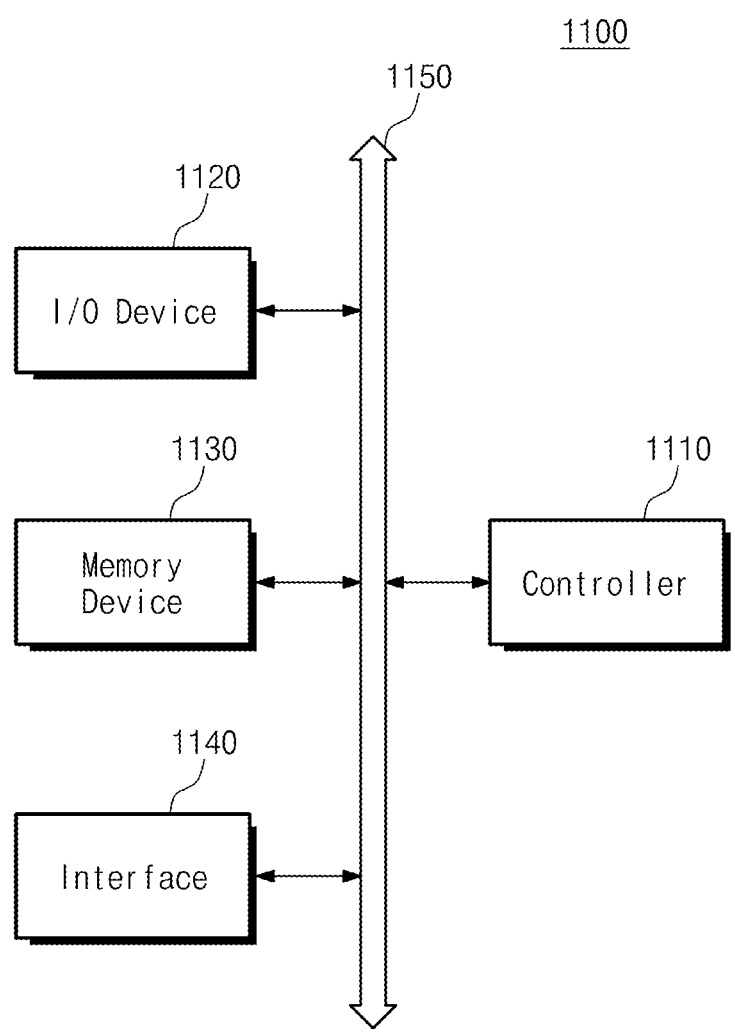
FIG. 8 is a block diagram illustrating an electronic system which includes a semiconductor memory device according to example embodiments of the inventive concepts.

FIG. 8 is a block diagram illustrating an electronic system which includes a semiconductor memory device according to example embodiments of the inventive concepts.

According to at least one example embodiment, referring to FIG. 8, an electronic system 1100 according to an example embodiment of the inventive concepts may include a controller 1110, an input/output (I/O) device 1120, a memory device 1130, an interface 1140, and a bus 1150. The controller 1110, the input/output device 1120, the memory device 1130 and/or the interface 1140 may be connected through the bus 1150. The bus 1150 corresponds to a path for the moving of data.

The controller 1110 may include at least one of a microprocessor, a digital signal processor, a microcontroller, and logic devices capable of performing a function similar to their function. The input/output device 1120 may include a keypad, a keyboard and a display device. The memory device 1130 may store data and/or commands. The memory device may include at least one of the semiconductor memory devices according to example embodiments of the inventive concepts. Also, the memory device 1130 may further include another type of semiconductor memory device (for example, flash memory device, DRAM and/or SRAM). The interface 1140 may transmit data to a communication network or receive data from the communication network. The interface 1140 may have a wired type or a wireless type. For example, the interface 1140 may include an antenna or a wired/wireless transceiver. Although not shown, the electronic system 1100 is a working memory for improving the operation of the controller 1110 and may further include a high-speed DRAM and/or SRAM.

The electronic system 1100 may be applied to Personal Digital Assistants (PDAs), portable computers, web tablets, wireless phones, mobile phones, digital music players, memory cards, and all electronic products enabling the transmission and/or reception of information at a wireless environment.

Figure 9:
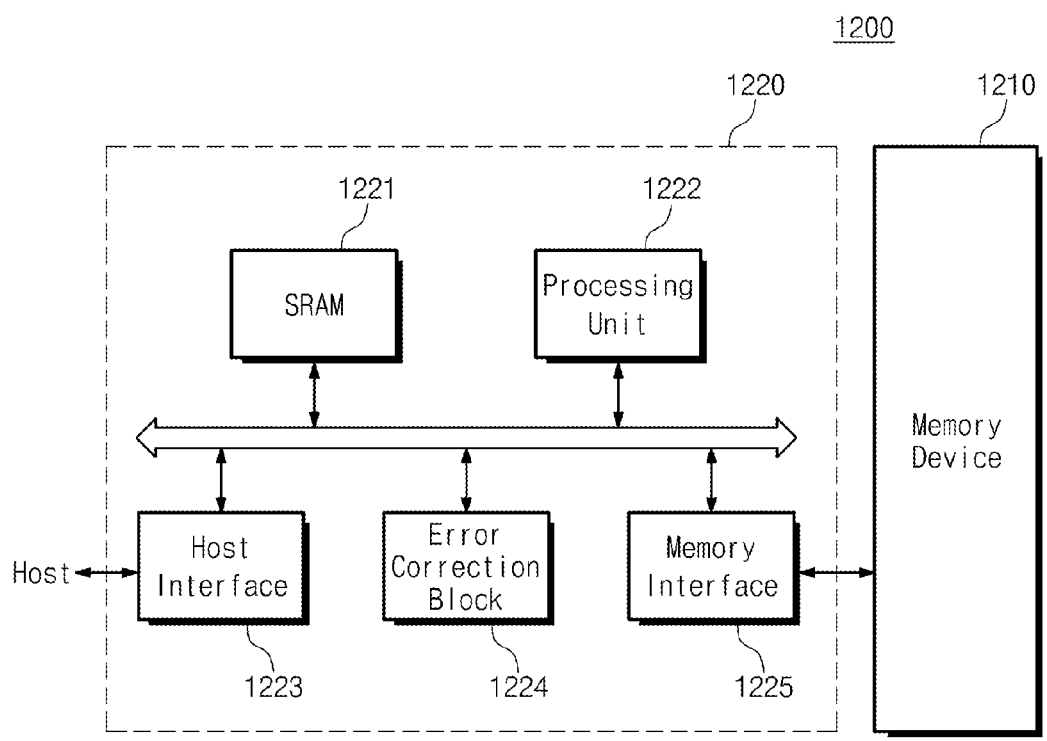
FIG. 9 is a block diagram illustrating a memory card which includes a magnetic memory device according to example embodiments of the inventive concepts.

FIG. 9 is a block diagram illustrating a memory card which includes a magnetic memory device according to example embodiments of the inventive concepts.

Referring to FIG. 9, a memory card 1200 according to an example embodiment of the inventive concepts includes a memory device 1210. The memory device 1210 may include at least one of the semiconductor memory devices according to example embodiments of the inventive concepts. Also, the memory device 1210 may further include another type of semiconductor memory device (for example, flash memory device, DRAM and/or SRAM). The memory card 1200 may include a memory controller 1220 for controlling data exchange between a host and the memory device 1210.

The memory controller 1220 may include a processing unit 1222 for controlling the overall operation of the memory card 1200. Also, the memory controller 1220 may include an SRAM 1221 that is used as a working memory of the processing unit 1222. In addition, the memory controller 1220 may further include a host interface 1223, and a memory interface 1225. The host interface 1223 may a data exchange protocol between the memory card 1200 and the host. The memory interface 1225 may interface the memory controller 1220 and the memory device 1210. Furthermore, the memory controller 1220 may further include an error correction block (ECC) 1224. The error correction block 1224 may detect and correct the error of data that is read from the memory device 1210. Although not shown, the memory card 1200 may further include a ROM device storing code data for interfacing with the host. The memory card 1200 may be used as a portable data storage card. Unlike this, the memory card 1200 may be implemented as a Solid State Disk (SSD) for replacing the hard disk of a computer system.

According to example embodiments of the inventive concepts, etching by-products produced during formation of a magnetic memory device can be easily removed and, at the same time, an oxide layer can be formed on its sidewall. As a result, reliability of the magnetic memory device can be enhanced and a method of forming the magnetic memory device can be simplified.

The above-disclosed subject matter is to be considered illustrative and not restrictive, and the appended claims are intended to cover all such modifications, enhancements, and other example embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method of forming a magnetic memory device, comprising:
   sequentially depositing a first magnetic layer, a tunnel barrier, and a second magnetic layer on a substrate;
   etching the second magnetic layer, the tunnel barrier layer, and the first magnetic layer to form magnetic tunnel junction structures; and
   performing an ion beam etching process on the magnetic tunnel junction structures using an oxygen-containing reactive source gas,
   wherein etching by-products on sidewalls of the magnetic tunnel junction structures are removed and the sidewalls of the magnetic tunnel junction structures are contemporaneously oxidized by the ion beam etching process, and
   wherein a sidewall oxide layer is formed along sidewalls of the first magnetic layer, the tunnel barrier, and the second magnetic layer by the ion beam etching process.

2. The method as set forth in claim 1, wherein the oxygen-containing reactive source gas does not include hydrogen.

3. The method as set forth in claim 1, wherein the oxygen-containing reactive source gas includes at least one of $O_2$, $O_3$, NO, $NO_2$, $N_2O$, CO, and $CO_2$.

4. The method as set forth in claim 1, wherein incident energy of the ion beam is about 1 keV or less.

5. The method as set forth in claim 1, wherein the ion beam etching process further comprises:
   performing the ion beam etching process using an inert gas as a source gas.

6. The method as set forth in claim 5, wherein the inert gas includes at least one of helium (He), neon (Ne), argon (Ar), krypton (Kr) and xenon (Xe).

7. The method as set forth in claim 1, wherein the ion beam etching process is performed at a temperature of about 10° C. to about 300° C.

8. The method as set forth in claim 1, wherein the sidewall oxide layer is a metal oxide layer.

9. The method as set forth in claim 1, wherein a thickness of the sidewall oxide layer is between about 1 nm and about 6 nm.

10. The method as set forth in claim 1, wherein etching the second magnetic layer, the tunnel barrier, and the first magnetic layer to form magnetic tunnel junction structures comprises reactive ion etching.

11. A method of forming a magnetic memory device, comprising:
    forming a magnetic layer on a substrate;
    patterning the magnetic layer to form magnetic patterns separated from each other; and
    performing an ion beam etching process on the patterned magnetic layer using an oxygen-containing reactive source gas,
    wherein conductive etching by-products formed on sidewalls of the magnetic patterns are removed and a metal-oxide layer is contemporaneously formed by the ion beam etching process on the sidewalls of the magnetic patterns.

12. The method as set forth in claim 11, wherein the oxygen-containing reactive source gas does not include hydrogen.

13. The method as set forth in claim 11, wherein the oxygen-containing reactive source gas includes at least one of $O_2$, $O_3$, NO, $NO_2$, $N_2O$, CO, and $CO_2$.

14. The method as set forth in claim 11, wherein incident energy of the ion beam is 1 about keV or less.

15. The method as set forth in claim 11, wherein the ion beam etching process further comprises:
    performing the ion beam etching process using an inert gas as a source gas.

* * * * *